US011333722B2

(12) United States Patent
Liu et al.

(10) Patent No.: US 11,333,722 B2
(45) Date of Patent: May 17, 2022

(54) GMI BIO-MAGNETIC MEASURING DEVICE BASED ON MAGNETIC-BEAD CONCENTRATION AND SIMULATED LESION SHAPE

(71) Applicant: Inner Mongolia University of Technology, Inner Mongolia (CN)

(72) Inventors: Jingshun Liu, Inner Mongolia (CN); Rui Liu, Inner Mongolia (CN); Guanyu Cao, Inner Mongolia (CN); Ze Li, Inner Mongolia (CN); Xufeng Wang, Inner Mongolia (CN)

(73) Assignee: INNER MONGOLIA UNIVERSITY OF TECHNOLOGY, Inner Mongolia (CN)

( * ) Notice: Subject to any disclaimer, the term of this patent is extended or adjusted under 35 U.S.C. 154(b) by 50 days.

(21) Appl. No.: 16/842,503

(22) Filed: Apr. 7, 2020

(65) Prior Publication Data
US 2021/0181273 A1 Jun. 17, 2021

(30) Foreign Application Priority Data
Dec. 16, 2019 (CN) .......................... 201911291834.1

(51) Int. Cl.
*G01R 33/09* (2006.01)
(52) U.S. Cl.
CPC ......... *G01R 33/091* (2013.01); *G01R 33/093* (2013.01)

(58) Field of Classification Search
CPC ............. G01R 33/098; G01R 33/0005; G01R 33/091; G01R 33/0093
See application file for complete search history.

(56) References Cited

U.S. PATENT DOCUMENTS

| 6,351,119 B1 * | 2/2002 | Kawase | ................. G01R 33/02 324/249 |
| 2016/0018347 A1 * | 1/2016 | Drbal | ..................... A61M 1/28 210/647 |

* cited by examiner

*Primary Examiner* — Alesa Allgood
(74) *Attorney, Agent, or Firm* — Crowell & Moring LLP; John C. Freeman, Esq.

(57) ABSTRACT

A GMI bio-magnetic measuring device based on a magnetic-bead concentration and a simulated lesion shape, includes an impedance analyzer, a Helmholtz coil, a metallic fiber, a fluxgate uniaxial magnetometer, a data acquisition card, a computer, a magnetic-bead-concentration adjustable platform and a lesion shape simulation platform. The metallic fiber is fixedly disposed on the magnetic-bead-concentration adjustable platform or the lesion shape simulation platform. Two terminals of the metallic fiber are electrically connected with a connection terminal of the magnetic-bead-concentration adjustable platform or the lesion shape simulation platform, and then are electrically connected with an input end of the impedance analyzer. An output end of the impedance analyzer is electrically connected with the computer. The magnetic-bead-concentration adjustable platform or the lesion shape simulation platform is placed at the interior of the Helmholtz coil. A probe of the fluxgate uniaxial magnetometer is disposed at the interior of the Helmholtz coil.

18 Claims, 8 Drawing Sheets

GMI BIO-MAGNETIC MEASURING DEVICE BASED ON MAGNETIC-BEAD CONCENTRATION AND SIMULATED LESION SHAPE

CROSS-REFERENCE TO RELATED APPLICATION

This application claims priority to Chinese Application No. 201911291834.1, filed Dec. 16, 2019, which is hereby incorporated by reference.

TECHNICAL FIELD

The present invention relates to the technical field of bio-magnetic measuring equipment, and in particular to a GMI bio-magnetic measuring device based on a magnetic-bead concentration and a simulated lesion shape.

BACKGROUND

A magnetic metallic fiber has attracted attention from the academic community due to its size and the magnetic properties exhibited by its microstructure, especially due to a Giant magnetoimpedance (GMI), and compared with an amorphous thin ribbon, a magnetic thin film and an electro-deposited composite wire, it has advantages such as a long-range random amorphous structure, good geometric symmetry, a smaller hysteresis loss, a near-zero magnetostriction coefficient and high permeability, and thus is more suitable for a novel magnetic sensitive material for a GMI sensor.

At present, a GMI-effect-based sensor in biomedicine has been developed and applied, such as a tumor sensor, a magnetic dust detection sensor, etc., and the research hotspot at home and abroad focuses on the biomedical field and continuously exploring basic issues such as a high-performance sensitive material and a micro-magnetic detection mechanism thereof. However, a bio-magnetic detection sensor based on the GMI effect of the magnetic metallic fiber has not yet been involved in research. Combining the performance advantages of the magnetic metallic fiber itself has important development and application prospects in the aspect of a bio-magnetic sensor, but usually the magnetic field strength of a magnetic field induction source in an organism is extremely small. Therefore, AllMag® PM3-020 magnetic beads are used as the marker to realize accurate detection of a weak magnetic field in a matrix, and meanwhile, both different magnetic-bead concentrations and lesion shapes will directly affect the detection of changes in the magnetic field in the organism by the GMI biosensor. For this problem, an appropriate magnetic-bead concentration is selected and a detectable lesion shape change range is simulated.

SUMMARY

An objective of the present invention is to provide a GMI bio-magnetic measuring device based on a magnetic-bead concentration and a simulated lesion shape, so as to solve the problems existing in the prior art and realize the detection of the magnetic-bead concentration and the simulated lesion shape based on the GMI effect of a metallic fiber.

To achieve the above purpose, the present invention provides the following solution.

The present invention provides a GMI bio-magnetic measuring device based on a magnetic-bead concentration and a simulated lesion shape, which includes an impedance analyzer, a Helmholtz coil, a metallic fiber, a fluxgate uniaxial magnetometer, a direct-current power supply, a current commutator, a data acquisition card, a computer, a magnetic-bead-concentration adjustable platform, and a lesion shape simulation platform having several curvature radii. The magnetic-bead-concentration adjustable platform or the lesion shape simulation platform is used for holding magnetic-bead-simulated biological fluid. The metallic fiber is fixedly placed on the magnetic-bead-concentration adjustable platform or the lesion shape simulation platform. Two ends of the metallic fiber are electrically connected with a connection terminal of the magnetic-bead-concentration adjustable platform or the lesion shape simulation platform and then are electrically connected with an input end of the impedance analyzer. An output end of the impedance analyzer is electrically connected with the computer. The magnetic-bead-concentration adjustable platform or the lesion shape simulation platform is placed at the interior of the Helmholtz coil. A probe of the fluxgate uniaxial magnetometer is disposed in an internal uniform magnetic field area of the Helmholtz coil. The probe, metallic fiber and Helmholtz coil are coaxial. The fluxgate uniaxial magnetometer is electrically connected with the computer, and the Helmholtz coil, the direct-current power supply, the current commutator, the data acquisition card and the computer are electrically connected sequentially.

Preferably, each of the magnetic-bead-concentration adjustable platform and the lesion shape simulation platform is provided with four connection terminals, and the magnetic-bead-concentration adjustable platform or the lesion shape simulation platform is connected with the impedance analyzer respectively by a four-terminal method.

Preferably, each of the magnetic-bead-concentration adjustable platform and the lesion shape simulation platform includes a base, a sliding table, a support frame, a conduit and a control valve, the sliding table is slidably disposed on the base, a groove is formed on the sliding table, the metallic fiber is fixed in the groove, the connection terminals are all disposed on the sliding table, the support frame is vertically fixed on the slide table, the conduit is fixed on the support frame, an outlet of the conduit is directly facing the groove, the control valve is disposed on the conduit, the magnetic-bead-simulated biological fluid is introduced into the conduit, the groove of the magnetic-bead-concentration adjustable platform is used for injecting the magnetic-bead-simulated biological fluid, the conduit of the lesion shape simulation platform is detachably connected with an adjustable magnetic-bead box, and the adjustable magnetic-bead box is used for holding the magnetic-bead-simulated biological fluid.

Preferably, a sliding groove is disposed on the base, the bottom of the sliding table is provided with a sliding block matched with the sliding groove, the conduit includes a first vertical part, a horizontal part and a second vertical part which are fixed and communicated sequentially, an inlet of the first vertical part is used for introducing the magnetic-bead-simulated biological fluid, the horizontal part is fixed on the support frame, and an outlet of the second vertical part is directly facing the groove.

Preferably, a connecting rod is fixedly connected onto the support frame, two clamping plates are fixedly connected onto the connecting rod, one end of the adjustable magnetic-bead box is installed between the two clamping plates, and the two clamping plates are fixedly connected by long bolts and nuts.

Preferably, the adjustable magnetic-bead box is of a U-shaped tube structure, and the curvature radii of the several adjustable magnetic bead boxes are different.

Preferably, the base, the sliding table, the support frame, the conduit, the control valve and the adjustable magnetic-bead box are all made of organic glass.

Preferably, the concentration of the magnetic beads is in a range of 0-500 μg/mL, and the curvature radius of the adjustable magnetic-bead box is in a range of 1 mm-4 mm.

Preferably, the impedance analyzer is electrically connected with the computer through a GPIB, the fluxgate uniaxial magnetometer is electrically connected with the computer through an RS-232C connector, and the current commutator is electrically connected with the computer through an USB interface.

The present invention also provides a method of using the aforementioned GMI bio-magnetic measuring device based on a magnetic-bead concentration and a simulated lesion shape, which includes the following steps: step 1. placement of a detection target: injecting a certain concentration of magnetic-bead-simulated biological fluid into the magnetic-bead-concentration adjustable platform, or injecting the same concentration of magnetic-bead-simulated biological fluid into the lesion shape simulation platform having different curvature radii, and placing the magnetic-bead-concentration adjustable platform or the lesion shape simulation platform onto an internal support frame of the Helmholtz coil; step 2. magnetic field correction: placing the Helmholtz coil perpendicular to the direction of a geomagnetic field to avoid interference to the geomagnetic field, firstly fixing the probe in the Helmholtz coil along an axial direction of the Helmholtz coil in such a manner that the position of the probe is parallel and consistent with the height of the metallic fiber, and adjusting the position of the Helmholtz coil to enable the fluxgate uniaxial magnetometer to display a magnetic field of 0 T, so as to complete zero magnetic field correction; turning on the direct-current power supply, turning on a data acquisition system of the computer, setting a magnetic field of 1 Oe for frequency scanning, observing the difference between the displayed reading of the fluxgate uniaxial magnetometer and the set value, such that magnetic field correction can be completed by adjusting a magnetic field transformation coefficient in the data acquisition system to make the two values close to each other; step 3. obtaining different external magnetic field values by adjusting the direct-current power supply; and step 4. changing the concentration of the magnetic-bead-simulated biological fluid or changing the curvature radius of the lesion shape simulation platform to obtain and analyze the magnetic impedance output characteristic of the metallic fiber, wherein the manner for analyzing an influencing rule is as follows:

magnetoimpedance change $$\text{rate}: \Delta Z/Z_{max}(\%) = \left[\frac{Z(H_{ex}) - Z(H_{max})}{Z(H_{max})}\right] \times 100\%;$$

$$\text{absolute variation quantity}: \Delta \eta = |\Delta Z/Z'_{max} - \Delta Z/Z_{max}|;$$

wherein $\Delta Z$ is the difference between the impedance under a different external magnetic field and the impedance under the maximum external magnetic field; $Z'_{max}$ is the impedance under the maximum external magnetic field after the magnetic-bead-simulated biological fluid is added; $Z_{max}$ is the impedance under the maximum external magnetic field without addition of the magnetic-bead-simulated biological fluid; $Z(H_{ex})$ is the impedance value under a specific external magnetic field; and $Z(H_{max})$ is the impedance value under the maximum external magnetic field.

The present invention achieves the following technical effects compared to the prior art.

In the present invention, firstly a certain concentration of the magnetic-bead-simulated biological fluid is injected into the magnetic-bead-concentration adjustable platform, or the same concentration of the magnetic-bead-simulated biological fluid is injected into the lesion shape simulation platform having different curvature radii, and the magnetic-bead-concentration adjustable platform or the lesion shape simulation platform are placed on an internal support frame of the Helmholtz coil; then the magnetic field correction in the Helmholtz coil is completed by utilizing the fluxgate uniaxial magnetometer, and then the concentration of the magnetic-bead-simulated biological fluid or the curvature radius of the lesion shape simulation platform is changed, such that the magnetic impedance output characteristic of the metallic fiber can be obtained, thereby realizing the detection of the magnetic-bead concentration and the shape change of the simulated lesion based on the GMI effect of the magnetic metallic fiber.

BRIEF DESCRIPTION OF THE DRAWINGS

To describe the technical solutions in the embodiments of the present invention or in the prior art more clearly, the following briefly introduces the accompanying drawings required for describing the embodiments. Apparently, the accompanying drawings in the following description show merely some embodiments of the present invention, and a person of ordinary skill in the art may still derive other drawings from these accompanying drawings without creative efforts.

DESCRIPTION OF THE EMBODIMENTS

The following clearly and completely describes the technical solutions in the embodiments of the present invention with reference to the accompanying drawings in the embodiments of the present invention. Apparently, the described embodiments are merely a part rather than all of the embodiments of the present invention. All other embodiments obtained by a of person of ordinary skill in the art based on the embodiments of the present invention without creative efforts briefly fall within the protection scope of the present invention.

To make the foregoing objective, features, and advantages of the present invention clearer and more comprehensible, the present invention is further described in detail below with reference to the accompanying drawings and specific embodiments.

Example 1

As shown in FIGS. 1-5, this example provided a GMI bio-magnetic measuring device based on a magnetic-bead concentration and a simulated lesion shape, which included an impedance analyzer 1, a Helmholtz coil 4, a metallic fiber 12, a fluxgate uniaxial magnetometer 5, a direct-current power supply 6, a current commutator 7, a data acquisition card 8, a computer 9, a magnetic-bead-concentration adjustable platform 2 and a lesion shape simulation platform 3 having several curvature radii. The magnetic-bead-concentration adjustable platform 2 or the lesion shape simulation platform 3 was used for holding magnetic-bead-simulated biological fluid 17. The metallic fiber 12 was fixedly disposed on the magnetic-bead-concentration adjustable platform 2 or the lesion shape simulation platform 3. Two ends of the metallic fiber 12 were electrically connected with a connection terminal 13 of the magnetic-bead-concentration adjustable platform 2 or the lesion shape simulation platform 3 by utilizing wires, and then were electrically connected with an input end of the impedance analyzer 1. An output end of the impedance analyzer 1 was electrically connected with the computer 9, where the model of the impedance analyzer 1 was HP 4192A, the model of the connection terminal matched with the impedance analyzer 1 was 16048B, and a test with a frequency range f of 5 Hz-13 MHz can be provided in the test process. The magnetic-bead-concentration adjustable platform 2 or the lesion shape simulation platform 3 was disposed at the interior of the Helmholtz coil 4. A probe of the fluxgate uniaxial magnetometer 5 was disposed at the interior of the Helmholtz coil 4. The probe, the metallic fiber 12 and the Helmholtz coil 4 were coaxial. The fluxgate uniaxial magnetometer 5 was electrically connected with the computer 9. The Helmholtz coil 4, the direct-current power supply 6, the current commutator 7, the data acquisition card 8 and the computer 9 were electrically connected sequentially, where the impedance analyzer 1 was electrically connected with the computer 9 through a GPIB, the fluxgate uniaxial magnetometer 5 was electrically connected with the computer 9 through an RS-232C connector, and the current commutator 7 was electrically connected with the computer 9 through a USB interface. Specifically, an output voltage value was adjusted through the direct-current power supply 6 to change an external magnetic field generated by the Helmholtz coil 4.

Figure 1:
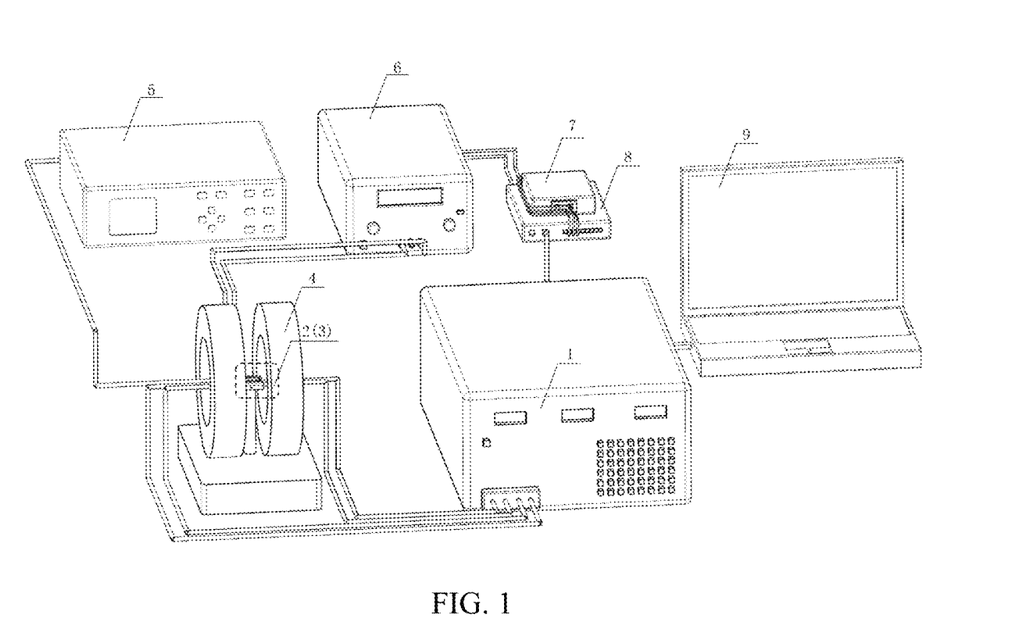
FIG. 1 is a schematic structural diagram of a GMI bio-magnetic measuring device based on a magnetic-bead concentration and a simulated lesion shape according to the present invention.

The Helmholtz coil 4 could provide an external magnetic field of up to 100 Oe, thereby widening the change range of the bio-magnetic measuring external magnetic field. The preferred magnetic field ranges in this example were ±90 Oe and ±10 Oe respectively, and could be adjusted by the highly-sensitive fluxgate uniaxial magnetometer 5 in such a manner that the magnetic field direction of the Helmholtz coil 4 was perpendicular to the direction of a geomagnetic field, so as to avoid the influence of the geomagnetic field on the magnetic field range. The computer 9 was provided with a data acquisition system set by utilizing LabView. The data acquisition system could control the output voltage value of the direct-current power supply 6 to control the periodic change of the external magnetic field of the Helmholtz coil 4, meanwhile automatically acquire the impedance data obtained by the impedance analyzer 1, and could establish a connection between the external magnetic field and the impedance data, thereby greatly improving the test efficiency.

Figure 2:
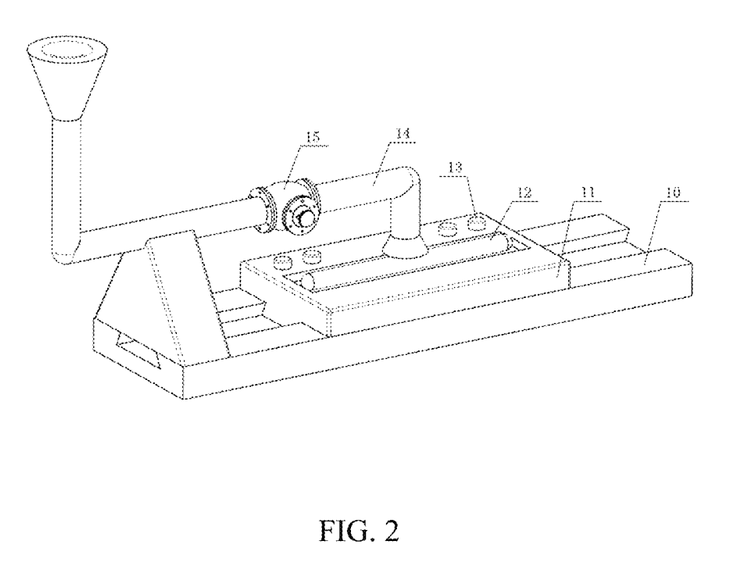
FIG. 2 is a schematic structural diagram of a magnetic-bead-concentration adjustable platform in the present invention.
Figure 3:
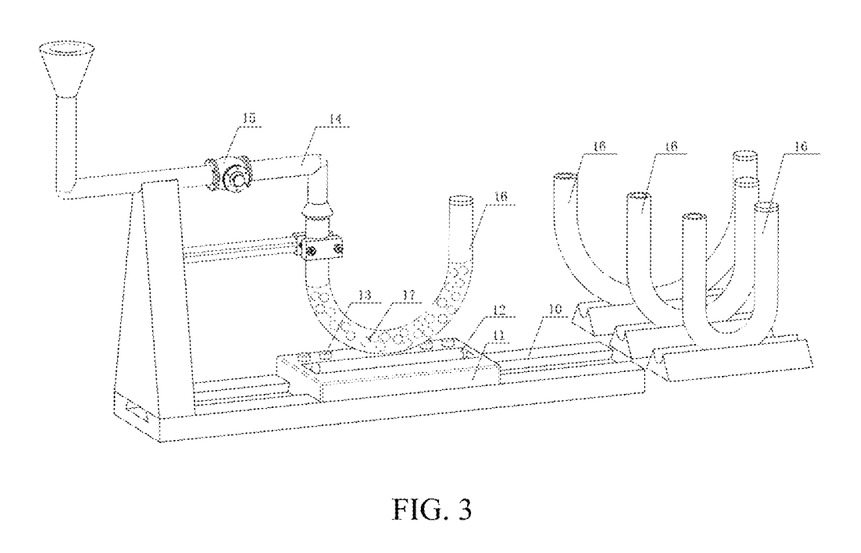
FIG. 3 is a schematic structural diagram of a lesion shape simulation platform in the present invention.
Figure 4:
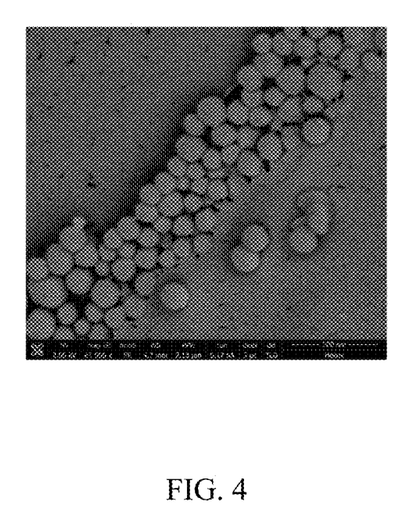
FIG. 4 is an SEM image of the magnetic beads of the present invention.
Figure 5:
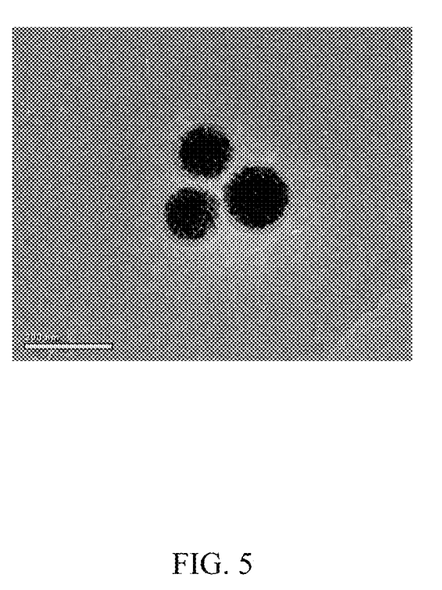
FIG. 5 is a TEM image of the magnetic beads of the present invention.

Specifically, each of the magnetic-bead-concentration adjustable platform 2 and the lesion shape simulation platform 3 included a base 10, a sliding table 11, a support frame, a conduit 14 and a control valve 15. The sliding table 11 was slidably disposed on the base 10. The sliding table 11 was provided with a groove. The metallic fiber 12 was fixed in the groove. Specifically, the metallic fiber 12 was connected onto a circuit board, and the circuit board was fixed in the groove of the base 10. The connection terminals 13 were all disposed on the sliding table 11. The support frame was vertically fixed on the sliding table 11. The conduit 14 was fixed on the support frame. An outlet of the conduit 14 was directly facing the groove. The magnetic-bead-simulated biological fluid 17 was introduced into the conduit 14. The groove of the magnetic-bead-concentration adjustable platform 2 was used for injecting the magnetic-bead-simulated biological fluid 17. The injection position of the magnetic-bead-simulated biological fluid 17 could be controlled by sliding the sliding table 11 on the base 10. The control valve 15 was disposed on the conduit 14 to control the flow rate of the magnetic-bead-simulated biological fluid 17, and different concentrations of the magnetic-bead-simulated biological fluid 17 could be injected into the conduit 14, where the concentration of the magnetic beads was in a range of 0-500 μg/mL. Meanwhile, the conduit 14 of the lesion shape simulation platform 3 was also detachably connected with an adjustable magnetic-bead box 16. The adjustable magnetic-bead box 16 was used for holding the magnetic-bead-simulated biological fluid 17. The adjustable magnetic-bead box 16 was of an U-shaped tube structure. The curvature radii of several adjustable magnetic-bead boxes 16 were different. That was, the change of the curvature radius of the adjustable magnetic-bead box 16 was realized by changing the radius of an arc at the bottom of the U-shaped tube structure, and the range of the curvature radius was 1 mm-4 mm. The base 10, the sliding table 11, the support frame, the conduit 14, the control valve 15 and the adjustable magnetic-bead box 16 were all made of organic glass, so that a experimenter can conveniently observe a specific test change process on the premise of avoiding interference from an external magnetic field, ensuring the accurate and error-free test. Four connection terminals 13 were disposed on each of the magnetic-bead-concentration adjustable platform 2 and the lesion shape simulation platform 3. The magnetic-bead-concentration adjustable platform 2 or the lesion shape simulation platform 3 were connected with the impedance analyzer 1 respectively by a four-terminal method, so as to realize measurement through the four-terminal method and ensure measurement accuracy.

Furthermore, a sliding groove was disposed on the base 10, the bottom of the sliding table 11 was provided with a sliding block matched with the sliding groove, and the sliding groove was configured to provide stable support for the sliding table 11, the supporting frame and the guide pipe 14, while ensuring that both the radial and axial centers of the metallic fiber 12 were positioned at the central position of the Helmholtz coil 4. The conduit 14 could further include a first vertical part, a horizontal part and a second vertical part which were fixed and communicated sequentially. An inlet of the first vertical part was used for introducing the magnetic-bead-simulated biological fluid 17. The horizontal part was fixed on the support frame. An outlet of the second vertical part was directly facing the groove. An outlet of the second vertical part of the magnetic-bead-concentration adjustable platform 2 directly injected the magnetic-bead-simulated biological fluid 17 into the groove. An outlet of the second vertical part of the lesion shape simulation platform 3 was detachably connected with the adjustable magnetic-bead box 16, and injected the magnetic-bead-simulated biological fluid 17 into the adjustable magnetic-bead box 16 through the conduit 14. A connecting rod was fixedly connected onto the support frame. Two clamping plates were fixedly connected onto the connecting rod. One end of the adjustable magnetic-bead box 16 was installed between the two clamping plates. The two clamping plates were fixedly connected by long bolts and nuts. The adjustable magnetic-bead box 16 was convenient to disassemble and could be clamped stably. Preferably, the connecting rod, the clamping plates, the long bolts, the nuts and the screws used at the electrical connection of the connection terminals 13 were all made of an organic glass material. In other words, all structures in the magnetic-bead-concentration adjustable platform 2 and the lesion shape simulation platform 3 were made of the organic glass material.

Preferably, the magnetic beads in the magnetic-bead-simulated biological fluid 17 were AllMag® superparamagnetic polymer carboxyl nanoparticles with high dispersibility and a uniform diameter, and the specific magnetic bead type is PM3-020. As could be seen from FIGS. 4 and 5, the diameter of the magnetic beads was about 180 nm, and the interior of the AllMag® superparamagnetic polymer carboxyl nanoparticles was a fine nanocrystal structure, which was generated due to the relatively high cooling rate during the forming process of the nanoparticles. It had the advantages of: a large specific surface area, a high magnetic content, excellent biological compatibility, good dispersibility and resuspendability in various solutions, capability of improving the detection efficiency and sensitivity, and thus was ideal magnetic beads for the bio-magnetic measuring test.

Example 2

This example also provided a method of using Example 1, which included the following steps: step 1. placement of a detection target, setting five different concentrations of magnetic beads according to the test, and sequentially injecting the five different concentrations of the magnetic-bead-simulated biological fluid 17 into the groove where the metallic fiber 12 was located through a valve of the magnetic-bead-concentration adjustable platform 2; or alternatively setting the curvature radii of the adjustable magnetic-bead box 16 to be 1 mm, 2 mm, 3 mm and 4 mm according to the test, sequentially changing the curvature radii of the adjustable magnetic-bead box 16, injecting the same concentrations of the magnetic-bead-simulated biological fluid 17 into the adjustable magnetic-bead box 16 having different curvature radii, and placing the magnetic-bead-concentration adjustable platform 2 or the lesion shape simulation platform 3 on the internal support frame of the Helmholtz coil 4; step 2. magnetic field correction: placing the Helmholtz coil 4 perpendicular to the direction of the geomagnetic field to avoid the interference from the geomagnetic field, firstly fixing the probe in the Helmholtz coil 4 along the axial direction of the Helmholtz coil 4 in such a manner that the position of the probe was parallel and consistent with the height of the metallic fiber 12, adjusting the position of the Helmholtz coil 4 to enable the fluxgate uniaxial magnetometer 5 to display a magnetic field of 0 T, so as to complete zero magnetic field correction; turning on the direct-current power supply 6, turning on the data acquisition system of the computer 9, setting a magnetic field of 1 Oe for frequency scanning, observing the difference between the displayed reading of the fluxgate uniaxial magnetometer 5 and the set value, such that the magnetic field correction could be completed by adjusting the magnetic field transformation coefficient in the data acquisition system to make the two values close to each other; where in an actual testing process, whether the magnetic field generated by the Helmholtz coil 4 is consistent with the preset magnetic field in intensity could also be monitored in real time by the fluxgate uniaxial magnetometer 5; step 3. obtaining different external magnetic field values by adjusting the direct-current power supply 6, or controlling the test frequency of the impedance analyzer 1; and step 4. changing the magnetic-bead-simulated biological fluid 17 or changing the lesion shape simulation platform 3 having different curvature radii to obtain and analyze the magnetic impedance output characteristic of the metallic fiber 12. Specifically, impedance signals were output through the connection terminals 13, so as to obtain the magnetic impedance output characteristics under different magnetic-bead concentrations and magnetic fields, or the variation laws of different curvature radii and impedances under a specific magnetic-bead concentration. Specifically, the method of analyzing the influencing rule of the giant magneto-impedance effect of the metallic fiber 12 was as follows:

The change of the absolute variation quantity $\Delta\eta$ of the maximum-impedance change rate $\Delta Z/Z_{max}$ (%) was analyzed, where the expressions of the impedance change rate and its absolute variation quantity $\Delta\eta$ were:

magnetoimpedance change $$\text{rate}: \Delta Z/Z_{max}(\%) = \left[\frac{Z(H_{ex}) - Z(H_{max})}{Z(H_{max})}\right] \times 100\%;$$

$$\text{absolute variation quantity}: \Delta\eta = |\Delta Z/Z'_{max} - \Delta Z/Z_{max}|;$$

where $\Delta Z$ was the difference between the highest impedance and the lowest impedance; $Z'_{max}$ was the highest impedance after the magnetic-bead-simulated biological fluid 17 was added; $Z_{max}$ was the highest impedance without addition of the magnetic-bead-simulated biological fluid 17; $Z(H_{ex})$ was the impedance value under a specific external magnetic field; and $Z(H_{max})$ was the impedance value under the maximum magnetic field.

Use Case 1

This real use case comprehensively applied Examples 1 and 2, and illustrated the effects of Examples 1 and 2 in combination with specific test results.

Figure 6:
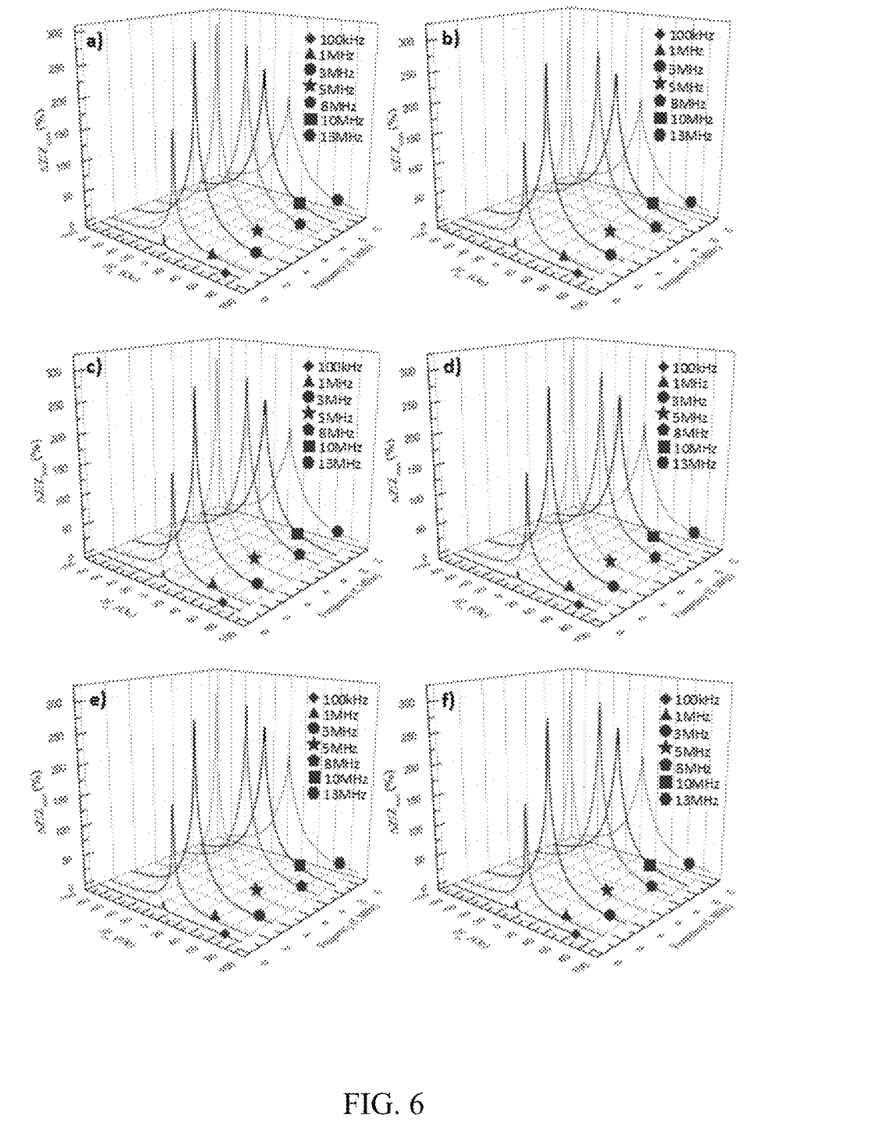
FIG. 6 is a curve graph showing the influence of different magnetic-bead concentrations dm on the impedance change rate of the metallic fiber in the use case 1.

The specific test results were as shown in a, b, c, d, e and f of FIG. 6, which corresponded to curves of influence on the impedance change rate when the magnetic-bead concentrations ($d_m$) in the magnetic-bead-simulated biological fluid 17 were 0 μg/mL, 50 μg/mL, 100 μg/mL, 300 μg/mL and 500 μg/mL, respectively. It could be seen from the figure that, the maximum-impedance change rate $[\Delta Z/Z_{max}]_{max}$ of the metallic fiber 12 could reach 312.8% as f=5 MHz when no magnetic-bead-simulated biological fluid 17 was added; and the $[\Delta Z/Z_{max}]_{max}$ decreased at each of different frequencies after the magnetic-bead-simulated biological fluid 17 was added. This was because that the magnetic-bead-simulated biological fluid 17 played a conductive role and reduced the resistance value of the metallic fiber 12, and it also meant that the impedance value of the metallic fiber 12 decreased, and thus the $[\Delta Z/Z_{max}]_{max}$ decreased. After the addition of the magnetic-bead-simulated biological fluid 17, the $[\Delta Z/Z_{max}]_{max}$ of the metallic fiber 12 started to increase with the increase of the concentration of the magnetic-bead-simulated biological fluid 17. When the content of the magnetic beads was 50 μg/mL, the $[\Delta Z/Z_{max}]_{max}$ increased at each of different frequencies. Especially when f=5 MHz, the $[\Delta Z/Z_{max}]_{max}$ reached 321.6%, which was increased by 8.8% as compared with a situation in which the magnetic-bead-simulated biological fluid 17 was not added. When the content of magnetic beads was 300 μg/mL, the $[\Delta Z/Z_{max}]_{max}$ of metallic fiber 12 reached the maximum of up to 326.7% at f=5 MHz, which was increased by 13.9% as compared with a situation in which the magnetic-bead-simulated biological fluid 17 was not added. Then when the content of magnetic beads was increased to 500 μg/mL, the $[\Delta Z/Z_{max}]_{max}$ tended to be flat, which was because that the magnetic beads almost completely covered the surface of metallic fiber 12 at 300 μg/mL. The impedance of the metallic fiber 12 tended to be consistent and changed with small variations when the concentration of magnetic beads continued to increase.

Use Case 2

This real use case comprehensively applied Examples 1 and 2, and illustrated the effects of Examples 1 and 2 in combination with specific test results.

The macroscopic morphology of a conventional organism changed after a pathological change occurred. In order to simulate the geometric shape of the surface of a biological lesion as much as possible, the deflection De (i.e., the curvature radius of the simulated shape of the diseased organism) was used for quantitative evaluation in Examples 1 and 2. Directing at the law of the impedance change rate brought about by the simulated shape change of the diseased organism, the influence of the simulated shape change of the diseased organism on the output of a GMI magnetic detection signal can be described more accurately.

Figure 7:
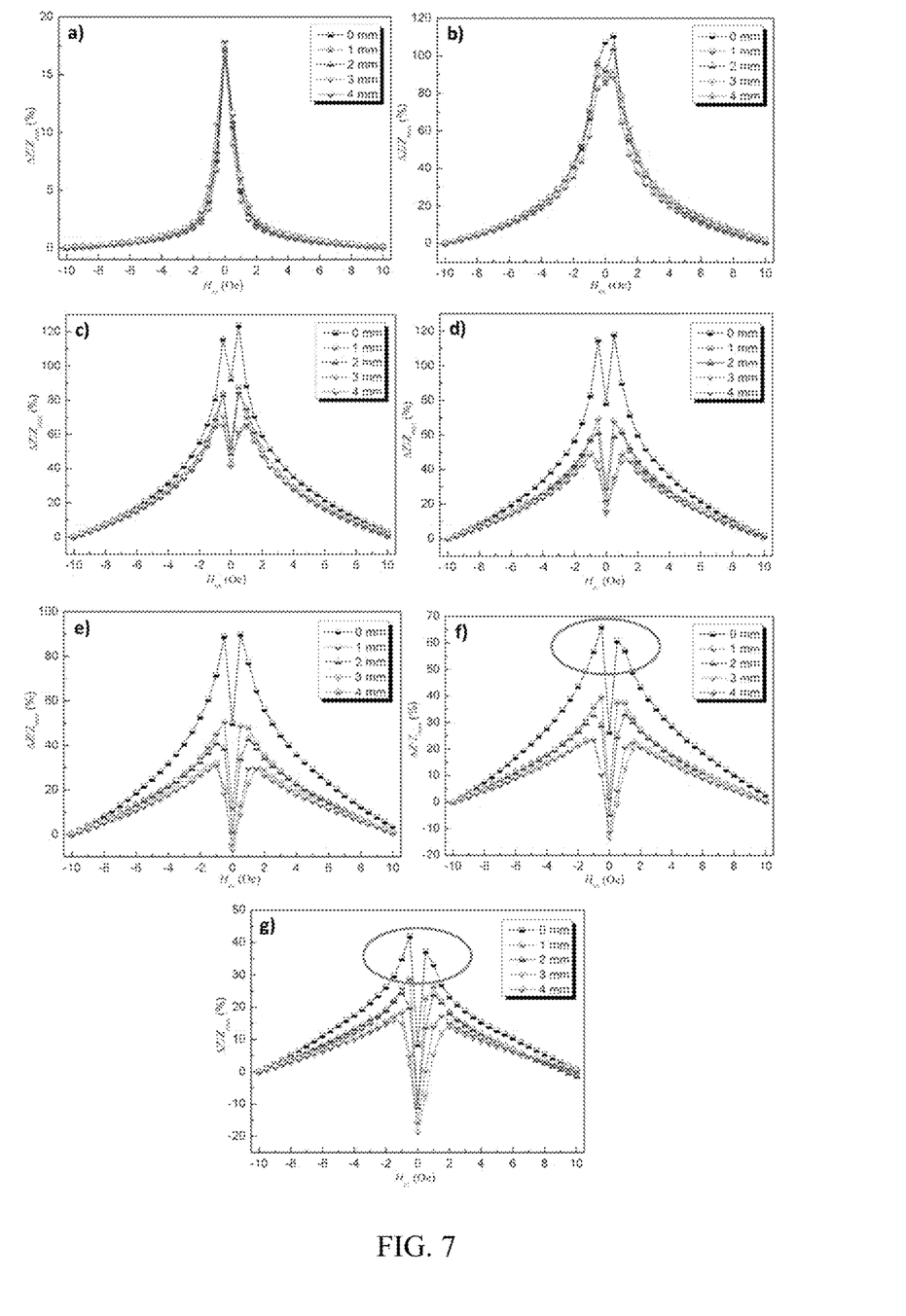
FIG. 7 is a curve graph showing a change in the impedance change rate of the metallic fiber along with a deflection De (the curvature radius of the adjustable magnetic-bead box) under different frequencies in the use case 2.

The specific test results were as shown in a, b, c, d, e, f and g in FIG. 7, which corresponded to curves of influence on the impedance change rate when the test frequencies were 100 kHz, 1 MHz, 3 MHz, 5 MHz, 8 MHz, 10 MHz and 13 MHz, respectively. As could be seen from the figure, with the increase of the deflection De, the impedance change rate decreased. When De was 0 mm, and f=3 MHz, 5 MHz, 8 MHz, 10 MHz and 13 MHz, the $\Delta Z/Z_{max}$ (%) of the metallic fiber 12 was 123.7%, 118.2%, 90.0%, 66.1% and 42.0%, respectively. When De was increased to 3 mm, the $\Delta Z/Z_{max}$ (%) decreased to 70.9%, 49.8%, 32.3%, 23.4% and 18.9%, respectively. This was because that after the increase of De, the magnetic-bead concentration in a cell of the diseased organism was decreased as compared with the previous concentration, resulting in the decrease in the influence of the magnetic field generated by the magnetic beads on the metallic fiber 12 and thus the decrease in the $\Delta Z/Z_{max}$ (%). When f=3 MHz-13 MHz, the impedance change rate curve generally had a "double peak" phenomenon, and with the increase of frequency, the symmetry of the curve showed good symmetry at 5 MHz-8 MHz, and when the frequency was between 100 kHz-3 MHz or 10 MHz-13 MHz, the curve was presented in asymmetric distribution. When f=8 MHz and De increased to 4 mm, the $\Delta Z/Z_{max}$ (%) of it decreased to the largest extent. Thus, when De changed, 5 MHz-8 MHz was the more sensitive frequency range during a magnetic measurement work.

Figure 8:
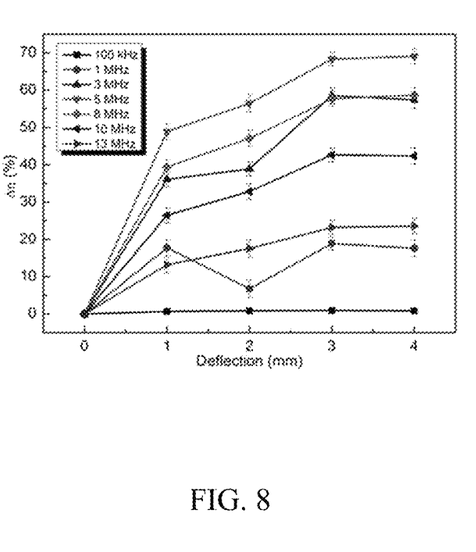
FIG. 8 is a curve graph showing the absolute variation quantity $\Delta \eta$ of the maximum-impedance change rate of the metallic fiber along with the deflection De (the curvature radius of the adjustable magnetic-bead box) under different frequencies in the use case 2, where, 1—an impedance analyzer, 2—an magnetic-bead-concentration adjustable platform, 3—a lesion shape simulation platform, 4—a Helmholtz coil, 5—a fluxgate uniaxial magnetometer, 6—a direct-current power supply, 7—a current commutator, 8—a data acquisition card, 9—a computer, 10—a base, 11—a sliding table, 12—a metallic fiber, 13—a connection terminal, 14—a conduit, 15—a control valve, 16—a adjustable magnetic-bead box, and 17—a magnetic-bead-simulated biological fluid.

As shown in FIG. 8 was a curve showing the change of the absolute variation quantity Δη of the maximum-impedance change rate $[\Delta Z/Z_{max}]_{max}$ of the metallic fiber 12 under different frequencies along with the change of the curvature radius (the deflection De) of the simulated shape of the diseased organism. The absolute variation quantity Δη of the impedance change rate increased with the increase of De. When the De increased to 3 mm, the variation quantity Δη was the largest. when f=1 MHz-13 MHz, the variation quantity Δη could reach 18.9%, 58.6%, 68.4%, 57.7%, 42.6% and 23.2%, respectively. When the De continued to increase to 4 mm, the $\Delta Z/Z_{max}$ (%) tended to be in a saturated state as compared with the situation when the De was 3 mm. In the range of f=100 kHz-5 MHz, the absolute variation quantity Δη of the maximum-impedance change rate under different Des increased with the increase of frequency; and in the range of f=5 MHz-13 MHz, the frequency increased and the variation quantity Δη gradually decreased. When f=5 MHz, the deflection De was 1 mm, 2 mm, 3 mm and 4 mm, and Δη was 48.9%, 56.5%, 68.4% and 69.1%, respectively. This further showed that 5 MHz-8 MHz was most suitable for the magnetic measurement work when the deflection De changed.

In summary, the present invention solves the problems of low sensitivity, a slow response speed, incapability of realizing miniaturization and the like of the existing bio-magnetic measuring device, and the device of the present invention is simple and practical, can realize purposes of high sensitivity, a fast response speed and the like, which lays a technical foundation for further developing a micro bio-magnetic measuring sensor from it.

Specific embodiments are applied in this specification to describe the principle and implementations of the present invention. The description of the aforementioned embodiments is only used for facilitating understanding of the method and the core idea of the present invention; and meanwhile, for those of ordinary skills in the art, there will be changes in specific implementations and application scope in accordance with the concept of the present invention. In conclusion, the content of this specification shall not be construed as a limitation to the present invention.

What is claimed is:

1. A GMI bio-magnetic measuring device based on a magnetic-bead concentration and a simulated lesion shape, comprising an impedance analyzer, a Helmholtz coil, a metallic fiber, a fluxgate uniaxial magnetometer, a direct-current power supply, a current commutator, a data acquisition card, a computer, a magnetic-bead-concentration adjustable platform, and a lesion shape simulation platform having several curvature radii, wherein the magnetic-bead-concentration adjustable platform or the lesion shape simulation platform is used for holding magnetic-bead-simulated biological fluid, the metallic fiber is fixedly placed on the magnetic-bead-concentration adjustable platform or the lesion shape simulation platform, two ends of the metallic fiber are electrically connected with a connection terminal of the magnetic-bead-concentration adjustable platform or the lesion shape simulation platform and then are electrically connected with an input end of the impedance analyzer, an output end of the impedance analyzer is electrically connected with the computer, the magnetic-bead-concentration adjustable platform or the lesion shape simulation platform is placed in an internal uniform magnetic field area of the Helmholtz coil, a probe of the fluxgate uniaxial magnetometer is disposed at the interior of the Helmholtz coil, the probe, metallic fiber and Helmholtz coil are coaxial, the fluxgate uniaxial magnetometer is electrically connected with the computer, and the Helmholtz coil, the direct-current power supply, the current commutator, the data acquisition card and the computer are electrically connected sequentially.

2. The GMI bio-magnetic measuring device according to claim 1, wherein each of the magnetic-bead-concentration adjustable platform and the lesion shape simulation platform is provided with four connection terminals, and the magnetic-bead-concentration adjustable platform or the lesion shape simulation platform is connected with the impedance analyzer respectively by a four-terminal method.

3. The GMI bio-magnetic measuring device according to claim 1, wherein the impedance analyzer is electrically connected with the computer through a GPIB, the fluxgate uniaxial magnetometer is electrically connected with the computer through an RS-232C connector, and the current commutator is electrically connected with the computer through an USB interface.

4. The GMI bio-magnetic measuring device according to claim 1, wherein each of the magnetic-bead-concentration adjustable platform and the lesion shape simulation platform comprises a base, a sliding table, a support frame, a conduit and a control valve, the sliding table is slidably disposed on the base, a groove is formed on the sliding table, the metallic fiber is fixed in the groove, the connection terminals are all disposed on the sliding table, the support frame is vertically fixed on the slide table, the conduit is fixed on the support frame, an outlet of the conduit is directly facing the groove, the control valve is disposed on the conduit, the magnetic-bead-simulated biological fluid is introduced into the conduit, the groove of the magnetic-bead-concentration adjustable platform is used for injecting the magnetic-bead-simulated biological fluid, the conduit of the lesion shape simulation platform is detachably connected with an adjustable magnetic-bead box, and the adjustable magnetic-bead box is used for holding the magnetic-bead-simulated biological fluid.

5. The GMI bio-magnetic measuring device according to claim 4, wherein a sliding groove is disposed on the base, the bottom of the sliding table is provided with a sliding block matched with the sliding groove, the conduit comprises a first vertical part, a horizontal part and a second vertical part which are fixed and communicated sequentially, an inlet of the first vertical part is used for introducing the magnetic-bead-simulated biological fluid, the horizontal part is fixed on the support frame, and an outlet of the second vertical part is directly facing the groove.

6. The GMI bio-magnetic measuring device according to claim 4, wherein a connecting rod is fixedly connected onto the support frame, two clamping plates are fixedly connected onto the connecting rod, one end of the adjustable magnetic-bead box is installed between the two clamping plates, and the two clamping plates are fixedly connected by long bolts and nuts.

7. The GMI bio-magnetic measuring device according to claim 4, wherein the base, the sliding table, the support frame, the conduit, the control valve and the adjustable magnetic-bead box are all made of organic glass.

8. The GMI bio-magnetic measuring device according to claim 4, wherein the adjustable magnetic-bead box is of a U-shaped tube structure, and the curvature radii of the several adjustable magnetic bead boxes are different.

9. The GMI bio-magnetic measuring device according to claim 8, wherein the concentration of the magnetic beads is in a range of 0-500 μg/mL, and the curvature radius of the adjustable magnetic-bead box is in a range of 1 mm-4 mm.

10. A method of using a GMI bio-magnetic measuring device magnetic-bead concentration and a simulated lesion shape, wherein the GMI bio-magnetic measuring device comprises an impedance analyzer, a Helmholtz coil, a metallic fiber, a fluxgate uniaxial magnetometer, a direct-current power supply, a current commutator, a data acquisition card, a computer, a magnetic-bead-concentration adjustable platform, and a lesion shape simulation platform having several curvature radii, wherein the magnetic-bead-concentration adjustable platform or the lesion shape simulation platform is used for holding magnetic-bead-simulated biological fluid, the metallic fiber is fixedly placed on the magnetic-bead-concentration adjustable platform or the lesion shape simulation platform, two ends of the metallic fiber are electrically connected with a connection terminal of the magnetic-bead-concentration adjustable platform or the lesion shape simulation platform and then are electrically connected with an input end of the impedance analyzer, an output end of the impedance analyzer is electrically connected with the computer, the magnetic-bead-concentration adjustable platform or the lesion shape simulation platform is placed in an internal uniform magnetic field area of the Helmholtz coil, a probe of the fluxgate uniaxial magnetometer is disposed at the interior of the Helmholtz coil, the probe, metallic fiber and Helmholtz coil are coaxial, the fluxgate uniaxial magnetometer is electrically connected with the computer, and the Helmholtz coil, the direct-current power supply, the current commutator, the data acquisition card and the computer are electrically connected sequentially;

the method of using the GMI bio-magnetic measuring device comprising:
placement of a detection target: injecting a certain concentration of magnetic-bead-simulated biological fluid into the magnetic-bead-concentration adjustable platform, or injecting the same concentration of magnetic-bead-simulated biological fluid into the lesion shape simulation platform having different curvature radii, and placing the magnetic-bead-concentration adjustable platform or the lesion shape simulation platform onto an internal support frame of the Helmholtz coil;
magnetic field correction: placing the Helmholtz coil perpendicular to the direction of a geomagnetic field to avoid interference to the geomagnetic field, firstly fixing the probe in the Helmholtz coil along an axial direction of the Helmholtz coil in such a manner that the position of the probe is parallel and consistent with the height of the metallic fiber, and adjusting the position of the Helmholtz coil to enable the fluxgate uniaxial magnetometer to display a magnetic field of 0 T, so as to complete zero magnetic field correction; turning on the direct-current power supply, turning on a data acquisition system of the computer, setting a magnetic field of 1 Oe for frequency scanning, observing the difference between the displayed reading of the fluxgate uniaxial magnetometer and the set value, such that magnetic field correction can be completed by adjusting a magnetic field transformation coefficient in the data acquisition system to make the two values close to each other;

obtaining different external magnetic field values by adjusting the direct-current power supply; and changing the concentration of the magnetic-bead-simulated biological fluid or changing the curvature radius of the lesion shape simulation platform to obtain and analyze the magnetic impedance output characteristic of the metallic fiber, wherein the manner for analyzing an influencing rule is as follows:

magnetoimpedance change $$\text{rate}: \Delta Z / Z_{max}(\%) = \left[\frac{Z(H_{ex}) - Z(H_{max})}{Z(H_{max})}\right] \times 100\%;$$

absolute variation quantity: $\Delta \eta = |\Delta Z / Z'_{max} - \Delta Z / Z_{max}|$;

wherein $\Delta Z$ is the difference between the impedance under a different external magnetic field and the impedance under the maximum external magnetic field; $Z'_{max}$ is the impedance under the maximum external magnetic field after the magnetic-bead-simulated biological fluid is added; $Z_{max}$ is the impedance under the maximum external magnetic field without addition of the magnetic-bead-simulated biological fluid; $Z(H_{ex})$ is the impedance value under a specific external magnetic field; and $Z(H_{max})$ is the impedance value under the maximum external magnetic field.

11. The method of using the GMI bio-magnetic measuring device according to claim 10,
wherein each of the magnetic-bead-concentration adjustable platform and the lesion shape simulation platform is provided with four connection terminals, and the magnetic-bead-concentration adjustable platform or the lesion shape simulation platform is connected with the impedance analyzer respectively by a four-terminal method.

12. The method of using the GMI bio-magnetic measuring device according to claim 10,
wherein each of the magnetic-bead-concentration adjustable platform and the lesion shape simulation platform comprises a base, a sliding table, a support frame, a conduit and a control valve, the sliding table is slidably disposed on the base, a groove is formed on the sliding table, the metallic fiber is fixed in the groove, the connection terminals are all disposed on the sliding table, the support frame is vertically fixed on the slide table, the conduit is fixed on the support frame, an outlet of the conduit is directly facing the groove, the control valve is disposed on the conduit, the magnetic-bead-simulated biological fluid is introduced into the conduit, the groove of the magnetic-bead-concentration adjustable platform is used for injecting the magnetic-bead-simulated biological fluid, the conduit of the lesion shape simulation platform is detachably connected with an adjustable magnetic-bead box, and the adjustable magnetic-bead box is used for holding the magnetic-bead-simulated biological fluid.

13. The method of using the GMI bio-magnetic measuring device according to claim 10,
wherein the impedance analyzer is electrically connected with the computer through a GPIB, the fluxgate uniaxial magnetometer is electrically connected with the computer through an RS-232C connector, and the current commutator is electrically connected with the computer through an USB interface.

14. The method of using the GMI bio-magnetic measuring device according to claim 12,
wherein a sliding groove is disposed on the base, the bottom of the sliding table is provided with a sliding block matched with the sliding groove, the conduit comprises a first vertical part, a horizontal part and a second vertical part which are fixed and communicated sequentially, an inlet of the first vertical part is used for introducing the magnetic-bead-simulated biological fluid, the horizontal part is fixed on the support frame, and an outlet of the second vertical part is directly facing the groove.

15. The method of using the GMI bio-magnetic measuring device according to claim 12,
wherein a connecting rod is fixedly connected onto the support frame, two clamping plates are fixedly connected onto the connecting rod, one end of the adjustable magnetic-bead box is installed between the two clamping plates, and the two clamping plates are fixedly connected by long bolts and nuts.

16. The method of using the GMI bio-magnetic measuring device according to claim 12,
wherein the base, the sliding table, the support frame, the conduit, the control valve and the adjustable magnetic-bead box are all made of organic glass.

17. The method of using the GMI bio-magnetic measuring device according to claim 12,
wherein the adjustable magnetic-bead box is of a U-shaped tube structure, and the curvature radii of the several adjustable magnetic bead boxes are different.

18. The method of using the GMI bio-magnetic measuring device according to claim 17,
wherein the concentration of the magnetic beads is in a range of 0-500 μg/mL, and the curvature radius of the adjustable magnetic-bead box is in a range of 1 mm-4 mm.

* * * * *

UNITED STATES PATENT AND TRADEMARK OFFICE
CERTIFICATE OF CORRECTION

PATENT NO. : 11,333,722 B2
APPLICATION NO. : 16/842503
DATED : May 17, 2022
INVENTOR(S) : Jingshun Liu et al.

It is certified that error appears in the above-identified patent and that said Letters Patent is hereby corrected as shown below:

In the Claims

Column 12, Claim 10, Line 17, insert --based on a-- between "device" and "magnetic-bead".

Signed and Sealed this
Twenty-third Day of August, 2022

Katherine Kelly Vidal
*Director of the United States Patent and Trademark Office*